(12) United States Patent
Cuvalci et al.

(10) Patent No.: US 9,543,186 B2
(45) Date of Patent: Jan. 10, 2017

(54) SUBSTRATE SUPPORT WITH CONTROLLED SEALING GAP

(71) Applicant: APPLIED MATERIALS, INC., Santa Clara, CA (US)

(72) Inventors: Olkan Cuvalci, Sunnyvale, CA (US); Joel M. Huston, San Jose, CA (US); Gwo-Chuan Tzu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 292 days.

(21) Appl. No.: 13/756,719

(22) Filed: Feb. 1, 2013

(65) Prior Publication Data

US 2014/0217665 A1    Aug. 7, 2014

(51) Int. Cl.
| | |
|---|---|
| *H01L 21/683* | (2006.01) |
| *H01L 21/687* | (2006.01) |
| *B25B 11/00* | (2006.01) |
| *H01L 21/67* | (2006.01) |

(52) U.S. Cl.
CPC ......... *H01L 21/6838* (2013.01); *B25B 11/005* (2013.01); *H01L 21/67126* (2013.01); *H01L 21/6875* (2013.01)

(58) Field of Classification Search
CPC ........... H01L 21/6838; H01L 21/67126; H01L 21/6875; B25B 11/005
USPC ............................................. 269/21, 20, 903
See application file for complete search history.

(56) References Cited

U.S. PATENT DOCUMENTS

| | | | |
|---|---|---|---|
| 4,213,698 A * | 7/1980 | Firtion et al. ................... 355/77 |
| 5,474,612 A * | 12/1995 | Sato et al. ...................... 118/725 |
| 5,656,093 A * | 8/1997 | Burkhart et al. ............. 118/728 |
| 6,053,982 A * | 4/2000 | Halpin et al. ................ 118/728 |
| 6,343,183 B1 | 1/2002 | Halpin et al. |
| 6,494,955 B1 * | 12/2002 | Lei et al. ...................... 118/715 |
| 6,513,796 B2 * | 2/2003 | Leidy et al. .................... 269/21 |
| 6,805,338 B1 * | 10/2004 | Okuda ........................... 269/21 |
| 6,917,755 B2 | 7/2005 | Nguyen et al. |
| 7,503,980 B2 | 3/2009 | Kida et al. |
| RE43,837 E | 12/2012 | Kida et al. |
| 2003/0001103 A1 * | 1/2003 | Kobayashi et al. ..... 250/440.11 |

(Continued)

FOREIGN PATENT DOCUMENTS

| | | |
|---|---|---|
| CN | 202049933 U | 11/2011 |
| JP | S62193139 A | 8/1987 |
| WO | WO 2006/069341 A2 | 6/2006 |

OTHER PUBLICATIONS

International Search Report and Written Opinion mailed Apr. 29, 2014 for PCT Application PCT/US2014/011819.

*Primary Examiner* — Joseph J Hail
*Assistant Examiner* — J Stephen Taylor
(74) *Attorney, Agent, or Firm* — Moser Taboada; Alan Taboada

(57) ABSTRACT

Embodiments of substrate supports are provided herein. In some embodiments, a substrate support may include a support plate having a support surface to support a substrate, a support ring to support a substrate at a perimeter of the support surface; and a plurality of first support elements disposed in the support ring, wherein an end portion of each of the first support elements is raised above an upper surface of the support ring to define a gap between the upper surface of the support ring and an imaginary plane disposed on the end portions of the plurality of first support elements.

19 Claims, 2 Drawing Sheets

(56) References Cited

U.S. PATENT DOCUMENTS

| | | | |
|---|---|---|---|
| 2003/0025259 A1* | 2/2003 | Nesbit .............................. | 269/21 |
| 2004/0198153 A1* | 10/2004 | Halpin et al. ................. | 446/259 |
| 2006/0130767 A1* | 6/2006 | Herchen ................ | G03B 27/32 |
| | | | 118/728 |
| 2013/0014896 A1 | 1/2013 | Shoji et al. | |
| 2013/0256966 A1 | 10/2013 | Volfovski et al. | |

* cited by examiner

SUBSTRATE SUPPORT WITH CONTROLLED SEALING GAP

FIELD

Embodiments of the present invention generally relate to semiconductor processing equipment.

BACKGROUND

Atomic layer deposition (ALD) and chemical vapor deposition (CVD) are two exemplary methods used in semiconductor fabrication to deposit thin films on a substrate in a processing chamber. Typical processing chambers include a substrate support, for example a substrate support plate, to support the substrate during processing. The substrate support plate may include channels or other recesses formed in a support surface of the substrate support plate, for example, to facilitate formation of a vacuum between a backside of the substrate and the support surface to chuck the substrate to the substrate support. The substrate support provides a seal with the backside of the substrate to allow the formation of the vacuum between the backside of the substrate and the support plate.

The inventors have also observed that substrate contact with some substrate support materials can cause undesirable substrate contamination. Elimination, or reduction, of substrate contact with those substrate support materials causing substrate contamination can eliminate, or reduce, substrate contamination.

Therefore, the inventors provide embodiments of an improved substrate support.

SUMMARY

Embodiments of substrate supports are provided herein. In some embodiments, a substrate support may include a support plate having a support surface a support plate having a support surface to support a substrate, a support ring to support a substrate at a perimeter of the support surface; and a plurality of first support elements disposed in the support ring, wherein an end portion of each of the first support elements is raised above an upper surface of the support ring to define a gap between the upper surface of the support ring and an imaginary plane disposed on the end portions of plurality of first support elements.

In some embodiments, a substrate support includes a support plate having a support surface to support a substrate; a support ring to support a substrate at a perimeter of the support surface; a plurality of first support elements disposed in the support ring, wherein the plurality of first support elements are spherical and fabricated from a non-metallic material, and wherein an end portion of each of the first support elements is raised above an upper surface of the support ring to define a gap between the upper surface of the support ring and an imaginary plane disposed on the end portions of the plurality of first support elements; and a plurality of second support elements disposed in the support surface, wherein the plurality of second support elements are spherical and fabricated from a non-metallic material, and wherein an end portion of each of the second support elements is raised above the support surface such that the end portions touch the imaginary plane and define a gap between the support surface and the imaginary plane.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
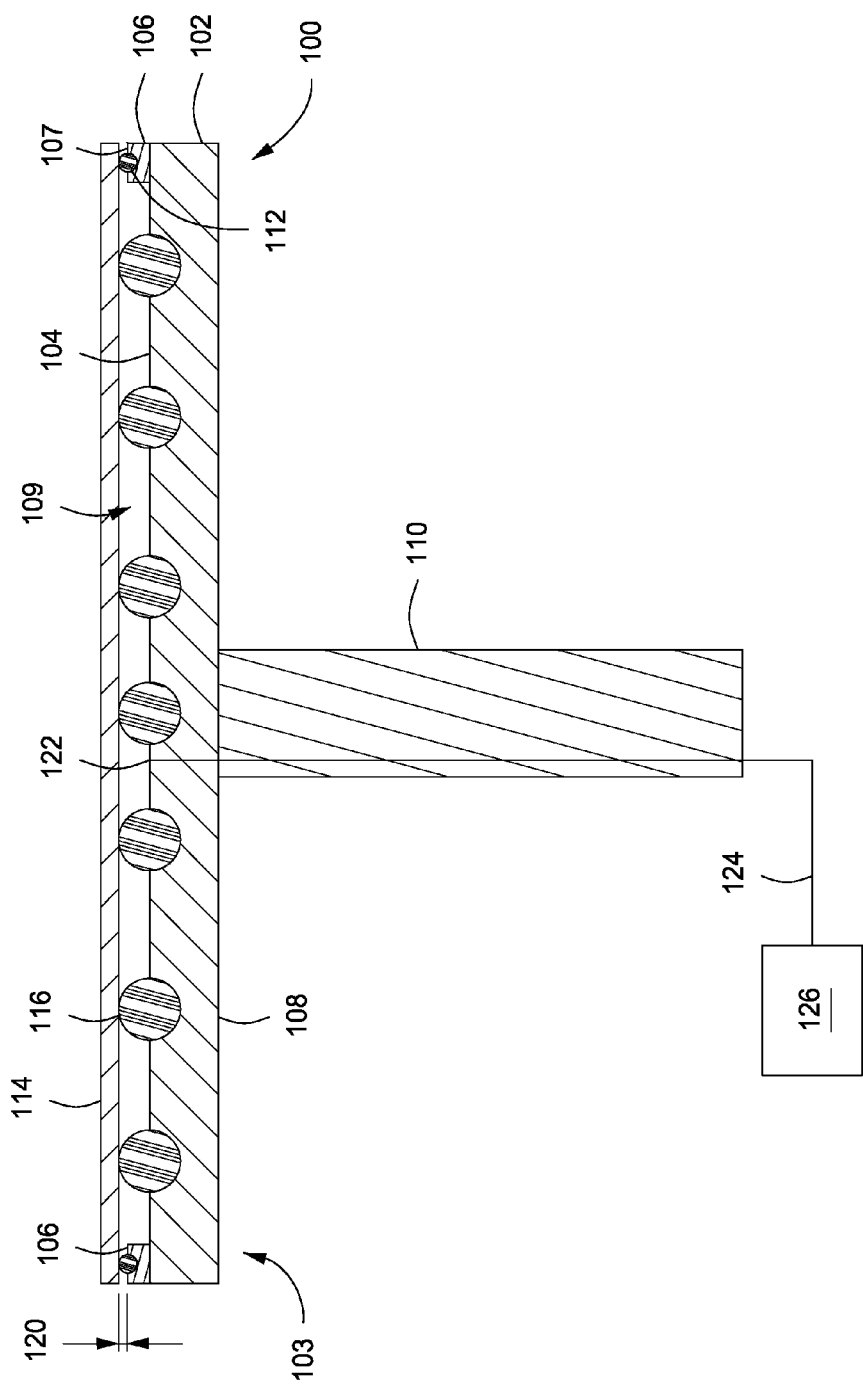
FIG. 1 depicts a side sectional view of a substrate support in accordance with some embodiments of the present invention having a substrate disposed on the substrate support.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Substrate support during semiconductor fabrication processes may be provided by substrate supports in accordance with embodiments disclosed herein. Embodiments may advantageously provide one or more of a controlled sealing gap, reduced metal contamination, and reduced thermal conduction to the substrate.

FIG. 1 depicts a substrate support 100 comprising a support plate 102 having a support surface 104 to support a substrate. In some embodiments, the support plate 102 is formed from a process compatible metallic material, for example aluminum, stainless steel, molybdenum or molybdenum alloys, nickel, or nickel-based alloys such as Hastelloy®, for a number of reasons including, among others, ease of fabrication and thermal considerations. In some embodiments, the support plate is formed from a process compatible non-metallic material, for example aluminum oxide ($Al_2O_3$) or ceramic materials such as aluminum nitride (AlN), for a number of reasons including, among others, reduced potential for substrate contamination.

The support plate 102 may be at least as large as a substrate 114 to be supported thereon. Substrate diameters may be, for example 200, 300, or 450 mm (7.87, 11.81, or 17.72 inches), although larger and smaller diameter substrates may also benefit from the features of the present invention.

In some embodiments, the support surface 104 is the same size as the substrate 114 to be support thereon. In other embodiments, the support surface 104 may be larger or smaller than the substrate 114.

Figure 3:
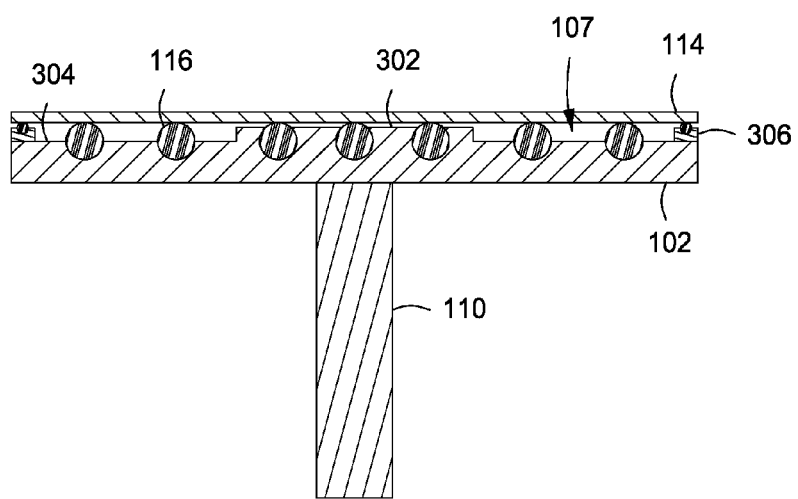
FIG. 3 depicts a side sectional view of a substrate support in accordance with some embodiments of the present invention and having a substrate disposed on the substrate support.

In the embodiment of FIG. 1, the support surface 104 is illustrated as a planar surface. In other embodiments, the support surface 104 is not planar. In some embodiments, the support surface 104 may have a varying profile. As used herein, a varying profile refers to a varying distance measured between the support surface 104 and an imaginary plane corresponding to a backside of a substrate when disposed on the substrate support 100 (e.g., a varying gap or recess between a substrate disposed on the substrate support 100 and the support surface 104). For example, as illustrated in FIG. 3, the plate 102 may have a central portion 302, an intermediate portion 304, and a perimeter portion 306. In some embodiments, the central portion 302 and perimeter portion 306 are offset in the same direction from the intermediate portion 304 (e.g., defining a varying gap between the top surface in each portion and the backside of the substrate). A support surface 104 having a varying profile may facilitate a more uniform temperature profile of a substrate 114 supported by the substrate support 100. Other configurations can be used, including configurations having more than, or fewer than, three portions. In some embodiments, the profile is a stepped between the portions as in FIG. 3. In other embodiments the profile has a gradual or sloping transition between the portions.

The support plate 102 may have one or more vacuum ports 122 (sometimes referred to as a vacuum chucking hole) disposed in the support surface 104. The vacuum ports 122 may be fluidly coupled to a vacuum source 126 (discussed below).

A support ring 106 may be disposed on the support plate 102 at or near the perimeter 103, i.e., at a perimetral region as illustrated in FIG. 1 with substrate 114 supported thereon. Advantageously, the support ring 106 sized to support the substrate to be supported thereon. The support ring 106 includes a central opening that exposes a portion of the support surface 104 of the support plate 102 such that a gap 109 is defined between the support surface 104, the support ring 106 and an imaginary plane corresponding to the position of a backside of a substrate 114 when disposed on the substrate support 100.

The support ring 106 may be integrally formed with the support plate 102 or may be separately formed. In embodiments in which the support ring 106 is separately formed, the support ring 106 may be formed from a malleable material, for example aluminum, sufficiently rigid to maintain its shape under processing conditions. A separately formed support ring 106 may be permanently or removably coupled to a perimeter of the support surface 104.

A support shaft 110 may be disposed beneath the support plate 102 to support the support plate 102. In some embodiments, the support shaft 110 may be affixed to a bottom surface 108 of the support plate 102. One or more conduits may be formed or disposed within the support shaft 110. For example, vacuum conduit 124 may be disposed within the support shaft 110 and fluidly coupled with the one or more vacuum ports 122 at a first end. A second end of the vacuum conduit 124 may be fluidly coupled with a vacuum source 126 to provide a reduced pressure at, or near, the support surface 104. In some applications (e.g., a vacuum chuck), the vacuum source 126 and the one or more vacuum ports 122 cooperate to create a vacuum condition to restrain the substrate 114 for processing.

A plurality of first support elements 112 are disposed in or on the support ring 106 to support the substrate 114 spaced apart from an upper surface 107 of the support ring 106. End portions of the first support elements 112 support the substrate 114 spaced apart from the support ring 106, forming a controlled edge gap or gap 120. Gap 120 is thus formed between the upper surface 107 of the support ring and an imaginary plane disposed on end portions of the plurality of first support elements 112. In some embodiments, the support ring 106 includes a plurality of recesses formed in the upper surface 107 suitable to secure a portion of a plurality of first support elements 112.

Additional second support elements 116 may be disposed within the perimeter of the support ring 106 to support interior portions of the substrate 114. The second support elements 116 may be disposed in or on the support plate 102 and have end portions substantially aligned with end portions of the first support elements 112 (e.g., ending in the same imaginary plane). The first and second support elements 112, 116 cooperate to support the substrate 114 spaced apart from the support surface 104, forming the gap 109.

The inventors have observed that, in some applications, when using a substrate support having a metal support plate in a substrate process (e.g., a deposition process), contamination of the substrate may occur as a result of metal-to-substrate contact. Accordingly, in some embodiments, the pluralities of first and second support elements 112, 116 are made from non-metallic materials. For example, the first and second support elements 112, 116 may be formed from non-metallic materials such as ceramic, e.g., aluminum nitride (AlN), or a crystalline form of aluminum oxide ($Al_2O_3$) (e.g., sapphire). In some embodiments, for example, where metal contamination is not an issue, the first and second support elements 112, 116 may be fabricated from process compatible metallic materials.

The inventors have observed that certain materials, for example aluminum oxide, used for the first and second support elements 112, 116 advantageously provide reduced thermal conductivity from the plate 102 to the substrate 114. By reducing the thermal conductivity to the substrate 114 at the location of the substrate support, uneven localized heating of the substrate 114 is reduced. Improved temperature uniformity has been observed to produce more uniform process results.

For ease of illustration only, the support elements 112, 116 are shown in FIG. 1 as having a spherical or substantially spherical shape. Other shapes, including cylindrical, conical, frustoconical, or polyhedral, such as pyramidal, may be advantageously used under some conditions. The shape of support elements 112, 116 may be selected to advantageously minimize the contact area between the support and the substrate 114, further reducing uneven heating of the substrate 114. For example, contact between a generally flat substrate at a curved support surface produces line contact (as with a cylindrical support) or point contact (as with a spherical support). Point contact may also result in the case of supporting a substrate on the apex of a pyramidal shaped support.

The first support elements 112 may be disposed within the support ring 106 such that a portion of the first support elements 112 is raised above the upper surface 107 of the support ring 106. The first support elements 112 may be disposed in the support ring 106 in any manner suitable to support the substrate 114 in a static or stable position during processing. For example, in some embodiments, the first support elements 112 may be partially recessed into the support ring 106, for example into pockets formed in the support ring. In such embodiments, the first support elements 112 may be secured in place via any means suitable, for example, such as a swaging process (e.g., via a swage press).

In some embodiments, the support ring 106 may be formed from multiple pieces, for example an inner ring and an outer ring, each formed with a pocket and, when assembled together with the first support elements 112, the pockets cooperate to secure the first support elements 112 in the support ring 106.

If formed separately from the support plate 102, the support ring 106 may be formed from any process compatible metallic material or materials, including non-limiting examples such as aluminum, stainless steel, molybdenum or molybdenum alloys, nickel, or nickel-based alloys such as Hastelloy®. In some embodiments, the support ring may be formed from non-metallic materials, including as a non-limiting example ceramic materials.

In addition to the first support elements 112 in the support ring 106 some embodiments include second support element 116 disposed partially within the plate 102 such that a portion of the second support elements 116 is between the substrate 114 and the support surface 104 to further support the substrate 114 above the plate 102. Second support elements may be similar, or substantially similar, to first support elements 112 and may be disposed in the plate 102 similarly to achieve a similar result.

In some embodiments, the first and second support element 112, 116 may be different sizes. In the non-limiting example of FIG. 1, first support elements 112 are depicted as smaller in diameter than second support elements 116. For example, in some embodiments, first support elements 112 may range in diameter from about 1 mm to about 3 mm (about 0.039-0.118 inches), for example, 2 mm (0.080 inch) in diameter, and second support elements 116 may range in diameter from about 2 mm to about 8 mm (about 0.079-0.315 inches) in diameter, for example 4 mm (0.160 inch) in diameter, although other diameters are contemplated for applications using spherical support elements. In some embodiments, the first support elements 112 are larger than the second support elements 116.

At the perimeter 103, a support surface of first support elements 112 is disposed above the upper surface 107 of the support ring 106, creating a controlled gap 120. As illustrated in FIGS. 1 and 3, substrate 114 is supported by the support surface. In some embodiments, the gap 120 is less than 0.254 mm (0.010 inch); in other embodiments the gap 120 is from 0.025-0.127 mm (0.001-0.005 inch), for example 0.051 mm (0.002 inch). The inventors have observed that by creating and maintaining a controlled gap between the substrate 114 and the support ring 106, the backside pressure formed in the gap 109 changes at a predictable rate. The vacuum components, i.e., the vacuum pump 126, vacuum conduit 124 and vacuum ports 122, used to form the backside pressure can advantageously be configured and operated appropriately to compensate for the predictable change in pressure, thereby beneficially establishing a uniform backside pressure during processing.

Figure 2:
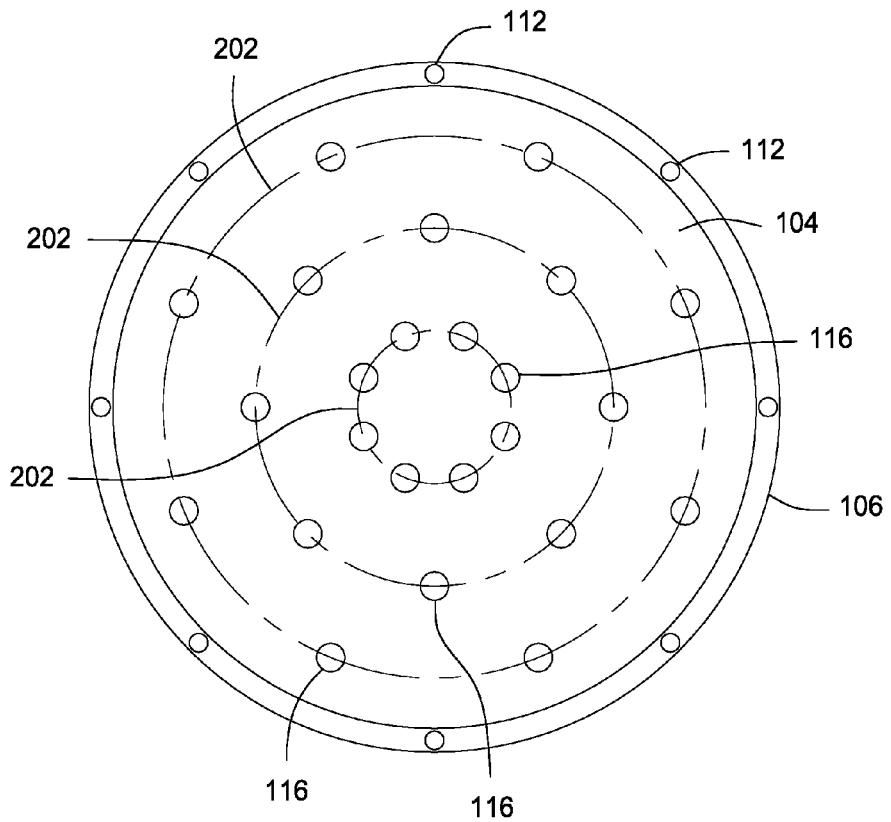
FIG. 2 depicts a top view of the substrate support of FIG. 1 with the substrate removed.

The first support elements 112 are generally evenly spaced around the perimeter of the exemplary support plate 102 as illustrated in FIG. 2. In a non-limiting example, the support elements 112 may be spaced apart by one inch along the perimeter of the support plate 102. In some embodiments, the second support elements 116 are arranged in concentric circles 202, with the supports 116 in each adjacent circle angularly offset from each other. In some non-limiting embodiments, the concentric circles 202 are spaced apart radially by one inch and the support elements may be spaced apart by one inch along each circle. Other uniform or varied radial or angular spacing patterns may be used.

Thus, embodiments of a substrate support ring with a plurality of support elements forming a controlled sealing gap have been provided herein. Benefits of the disclosed invention may include one or more of reduced metal contamination of the substrate, reduced heat transfer from the support ring to the substrate, and provision of a controlled sealing gap to facilitate uniform pressure formation and maintenance.

While the foregoing is directed to embodiments of the present invention, other and further embodiments of the invention may be devised without departing from the basic scope thereof.

The invention claimed is:

1. A substrate support, comprising:
   a support plate having a support surface to support a substrate, wherein the support surface spans the entire width of the support plate;
   a support ring to support a substrate at a perimeter of the substrate support;
   a plurality of first support elements disposed in the support ring, wherein an end portion of each of the first support elements is raised above an upper surface of the support ring to define a gap between the upper surface of the support ring and an imaginary plane disposed on the end portions of the plurality of first support elements;
   a vacuum source; and
   one or more ports disposed in the support surface of the support plate, wherein all ports disposed in the support surface are fluidly coupled to the vacuum source, and wherein the support ring rests on the support plate along an entire circumference of the support ring.

2. The substrate support of claim 1, wherein the plurality of first support elements are at least partially recessed into the upper surface of the support ring.

3. The substrate support of claim 1, wherein the first support elements have a substantially spherical shape.

4. The substrate support of claim 3, wherein the first support elements have a diameter of about 0.039 to about 0.118 inches.

5. The substrate support of claim 1, wherein the first support elements are non-metallic.

6. The substrate support of claim 1, wherein the first support elements are fabricated from at least one of aluminum nitride or aluminum oxide.

7. The substrate support of claim 1, wherein the first support elements are fabricated from sapphire.

8. The substrate support of claim 1, wherein a support surface of the first support elements is disposed about 0.001 to about 0.005 inches above the upper surface.

9. The substrate support of claim 1, wherein at least one of the support plate or the support ring is fabricated from a metallic material.

10. The substrate support of claim 1, wherein the support ring is a separate component from the support plate and is coupled to a perimeter of the support surface.

11. The substrate support of claim 1, wherein the support plate comprises a plurality of second support elements having a portion disposed above the support surface of the support plate, wherein the plurality of first support elements and the plurality of second support elements support the substrate above an upper surface of the support ring, wherein the plurality of second support elements are disposed radially inward of the support ring.

12. The substrate support of claim 11, wherein the second support elements have a spherical shape.

13. The substrate support of claim 12, wherein the second support elements have a diameter of about 0.079 to about 0.315 inches.

14. The substrate support of claim 11, wherein the second support elements are non-metallic.

15. The substrate support of claim 11, wherein the second support elements are fabricated from sapphire.

16. The substrate support of claim 1, wherein the support surface is planar.

17. The substrate support of claim 1, wherein the support surface comprises a varying profile.

18. A substrate support, comprising:
a support plate having an outer sidewall;
a support ring to support a substrate above the support plate, wherein an outer sidewall of the support ring and the outer sidewall of the support plate form a common outer sidewall of the substrate support, and wherein the support ring rests on the support plate along an entire perimeter of the support ring; and
a plurality of first support elements disposed in the support ring, wherein an end portion of each of the first support elements is raised above an upper surface of the support ring to define a gap between the upper surface of the support ring and an imaginary plane disposed on the end portions of the plurality of first support elements.

19. The substrate support of claim 18, further comprising:
a plurality of second support elements disposed in the support plate, wherein the plurality of second support elements are spherical and fabricated from a non-metallic material, and wherein an end portion of each of the second support elements is raised above the support plate such that the end portions touch the imaginary plane and define a gap between the support plate and the imaginary plane.

* * * * *